(12) United States Patent
Herring et al.

(10) Patent No.: US 10,712,426 B2
(45) Date of Patent: Jul. 14, 2020

(54) FAULT TOLERANT DIGITAL INPUT RECEIVER CIRCUIT

(71) Applicant: TEXAS INSTRUMENTS INCORPORATED, Dallas, TX (US)

(72) Inventors: Kevin Paul Herring, Kent, OH (US); Anant Shankar Kamath, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/411,285

(22) Filed: May 14, 2019

(65) Prior Publication Data

US 2020/0182965 A1 Jun. 11, 2020

Related U.S. Application Data

(60) Provisional application No. 62/777,873, filed on Dec. 11, 2018.

(51) Int. Cl.
| | |
|---|---|
| *H04B 1/04* | (2006.01) |
| *G01S 7/285* | (2006.01) |
| *H04B 1/18* | (2006.01) |
| *H02H 9/02* | (2006.01) |
| *G01R 19/10* | (2006.01) |
| *H03K 19/17784* | (2020.01) |

(52) U.S. Cl.
CPC ............ *G01S 7/285* (2013.01); *G01R 19/10* (2013.01); *H02H 9/025* (2013.01); *H03K 19/17784* (2013.01); *H04B 1/18* (2013.01)

(58) Field of Classification Search
CPC . H04B 1/16; H04B 1/18; H04B 17/12; H04B 17/17; H03K 19/01852; H03K 19/17784; H03K 5/2481; H04L 25/0278; H04L 25/028; H02P 9/006; H02H 9/025; G01R 19/10; G01S 7/285
See application file for complete search history.

(56) References Cited

U.S. PATENT DOCUMENTS

| | | | |
|---|---|---|---|
| 6,943,591 B1 * | 9/2005 | Hannan | H04L 25/0276 327/18 |
| 10,361,732 B1 * | 7/2019 | Jagannathan | H04B 17/18 |
| 2009/0167266 A1 * | 7/2009 | Al-Shyoukh | G05F 1/569 323/276 |

(Continued)

*Primary Examiner* — Thanh C Le
(74) *Attorney, Agent, or Firm* — John R. Pessetto; Charles A. Brill; Frank D. Cimino

(57) ABSTRACT

A digital input receiver system comprises a first input receiver having a first current limiter input, and a first voltage comparator input coupled to a first node. A first resistor is coupled between the first node and the first current limiter input. The first input receiver outputs a digital logic signal and is coupled to a second node. The receiver system further comprises a second input receiver having a second current limiter input, and a second voltage comparator input coupled to the second node. A second resistor is coupled between the second node and the second current limiter input. The second input receiver outputs a malfunction signal. The first and second input receivers are configured to limit current through the receiver system to less than an overcurrent threshold of the first and second input receivers.

24 Claims, 4 Drawing Sheets

(56) References Cited

U.S. PATENT DOCUMENTS

| | | | | |
|---|---|---|---|---|
| 2013/0207665 A1* | 8/2013 | Bandyopadhyay | ..... | G01R 31/02 |
| | | | | 324/537 |
| 2017/0244441 A1* | 8/2017 | Cavaliere | ..... | H04B 1/40 |
| 2017/0366125 A1* | 12/2017 | Joyce | ..... | H02P 9/006 |
| 2018/0152017 A1* | 5/2018 | Langer | ..... | H02H 9/025 |
| 2018/0328973 A1* | 11/2018 | Kamath | ..... | G01R 31/2829 |

\* cited by examiner

FAULT TOLERANT DIGITAL INPUT RECEIVER CIRCUIT

CROSS-REFERENCE TO RELATED APPLICATIONS

This application claims priority to U.S. Provisional Application No. 62/777,873, filed Dec. 11, 2018, which is hereby incorporated by reference.

BACKGROUND

Digital input modules are used in programmable logic controllers, motor drivers, and other circuits to convert high voltage digital inputs from field sensors and switches into digital logic signals, which are provided to other circuits. In response to the input voltage being greater than a triggering voltage, the digital logic signal is logic high. In response to the input voltage being less than the triggering voltage, the digital logic signal is logic low. Many digital input modules include a current limiter to reduce current drawn from the voltage inputs and reduce power dissipation through the digital input module.

Some digital input modules are not protected against fault conditions arising from short circuits within the digital input module. In the event of a short circuit, current within the digital input module increases and may result in overcurrent and overheating conditions, causing the digital input module to malfunction. In some cases, the digital input module malfunction causes secondary effects in other circuits configured to receive the digital logic signal output by the digital input module. Some digital input modules cannot detect device malfunctions from short circuits, which causes the digital logic signal output by the digital input module to carry incorrect information to other circuits configured to receive it. This causes the other circuits to operate under mistaken information regarding the voltage input to the digital input module.

SUMMARY

In some implementations, a digital input receiver system comprises a first resistor coupled to a first node and a first input receiver having a first voltage comparator input coupled to the first node and a first current limiter input coupled to the first resistor. The first input receiver is configured to output a digital logic signal and is further coupled to a second node. The receiver system further comprises a second resistor is coupled to the second node and a second input receiver having a second voltage comparator input coupled to the second node and a second current limiter input coupled to the second resistor. The second input receiver is configured to output a malfunction signal.

The first input receiver is configured to limit current within the receiver system to a first current and the second input receiver is configured to limit current within the receiver system to a second current. The first and second currents are less than an overcurrent threshold of the first and second input receivers. In some implementations, the first current is less than the second current, and the malfunction signal is indicative of current through the receiver system being the second current, rather than the first current. In some implementations, the digital logic signal is indicative of a voltage on the first node being greater than a programmable trigger voltage.

BRIEF DESCRIPTION OF THE DRAWINGS

For a detailed description of various examples, reference will now be made to the accompanying drawings in which.

DETAILED DESCRIPTION

Figure 1:
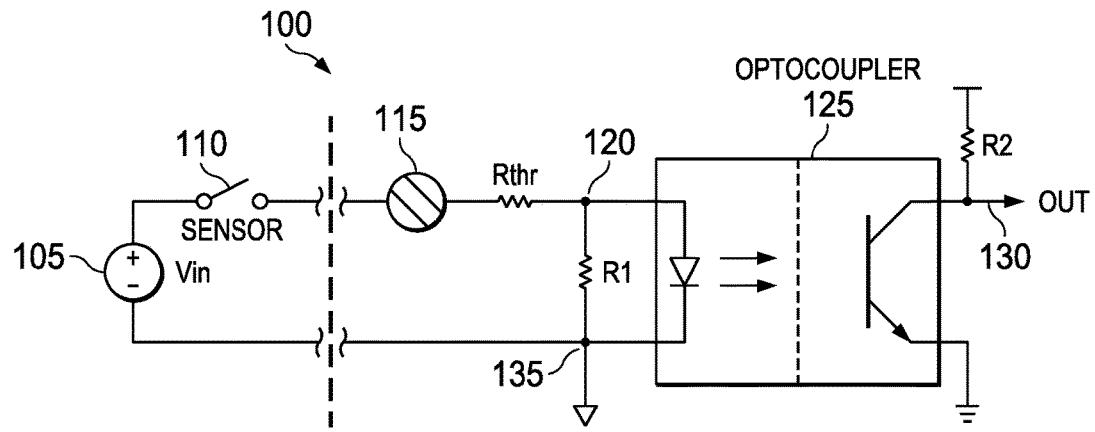
FIG. 1 illustrates an example digital input buffer.

As described herein, a digital input receiver circuit includes two digital input receivers in series, each of which is configured in parallel with a current limiter. The second current limiter has a current limit greater than the current limit of the first current limiter, such that the second digital input receiver outputs a logic low signal as long as the first digital input receiver operates correctly, and the first current limiter sets the current input to the second digital receiver and the second current limiter to the lower first current limit. If the first current limiter or the first digital input receiver malfunctions and the current input to the second digital receiver and the second current limiter increases beyond the first current limit, the second digital input receiver acts as a malfunction detector within the digital input receiver circuit and outputs a logic high signal. The second current limiter limits the current within the digital input receiver circuit and guards the receiver circuit against overcurrent conditions caused by short circuits.

In one example, the digital input receiver circuit includes a threshold resistor, whose value is determined based on the desired triggering voltage for the receiver circuit. The threshold resistor is coupled to the first digital input receiver and to a first sense resistor. The first sense resistor is coupled to the first current limiter, and works in combination with the first current limiter to set the first current limit. The first current limiter is coupled to the first digital input receiver at a midpoint node. The second digital input receiver and a second sense resistor are coupled to the midpoint node. The second sense resistor is coupled to the second current limiter, and works in combination with the second current limiter to set the second current limit. The second current limiter is further coupled to the second digital input receiver.

In the event of a short circuit across a threshold resistor included in the digital input receiver circuit, the first or the second current limiter will limit the current within the receiver circuit and prevent overcurrent and overheating conditions that might cause the first and second digital input receivers to malfunction. In the event of a short circuit across the second digital input receiver, the first digital input receiver continues to operate as normal. In the event of a short circuit across the first digital input receiver, the second current limiter will limit the current within the receiver circuit and prevent overcurrent and overheating conditions that might cause the first and second digital input receivers to malfunction. The second digital input receiver outputs a logic high signal in response to the current within it being the second current limit, not the first current limit, which indicates a malfunction within the digital input receiver circuit. In response, circuits receiving the outputs of the digital input receiver circuit can adjust operation accordingly.

FIG. 1 illustrates an example digital input buffer 100. A power supply Vin 105 is coupled to a sensor 110, which acts as a closed switch in response to a control signal. The control signal can be from a digital controller associated with digital input buffer 100, from another sensor on the semiconductor die such as a temperature sensor, or from any appropriate source. For example, sensor 110 can be a pressure switch and act as a closed switch in response to pressure. Screw terminal 115 connects Vin 105 and sensor 110 to the threshold resistor Rthr. Rthr is further coupled to R1 and optocoupler 125 at node 120. The value of Rthr is chosen based on the desired triggering voltage Vtrigger for buffer 100. R1 is further coupled to common mode node 135. R2 is coupled to a supply voltage and the output of optocoupler 125. Optocoupler 125 provides an output signal OUT 130 to other circuits, such as a controller. OUT 130 is logic high in response to Vin 105 being greater than Vtrigger and logic low in response to Vin 105 being less than Vtrigger. Optocoupler 125 is further coupled to common mode node 135.

Optocoupler 125 is not protected against fault conditions caused by short circuits within buffer 100. In the event of a short circuit across Rthr, short circuit 1, the actual Vtrigger for buffer 100 decreases below the desired triggering voltage. This may cause OUT 130 to be logic high, despite Vin 105 being less than the desired triggering voltage. In addition, the current through optocoupler 125 increases, and may result in overcurrent or overheating conditions within optocoupler 125. In some examples, this causes optocoupler 125 to malfunction, which in turn may cause secondary effects in other circuits receiving OUT 130.

In the event of a short circuit between node 120 and node 135, short circuit 2, the current through buffer 100 bypasses both R1 and optocoupler 125, causing the output signal OUT 130 from optocoupler 125 and buffer 100 to remain logic low. Buffer 100 does not recognize the fault condition and indicates Vin 105 is less than Vtrigger, regardless of the actual value of Vin 105. The input error in digital input buffer 100 may propagate errors in other circuits receiving OUT 130, as the signal indicates Vin 105 is less than Vtrigger. Table 1 illustrates the different operating conditions of buffer 100 and the different values of Vin 105, as well as the corresponding result within the circuit and OUT 130 while sensor 110 acts as a closed switch.

TABLE 1

| Operating Condition | Results | Vin 105 | OUT 130 |
|---|---|---|---|
| Normal | Normal operation | < desired Vtrigger | 0 |
| | | > desired Vtrigger | 1 |
| Short 1 | Variation in actual Vtrigger away from desired Vtrigger | < desired Vtrigger | Variable |
| | Increased current through R1 and optocoupler 125 → potential for overcurrent and overheating conditions within optocoupler 125 | > desired Vtrigger | 1 |
| Short 2 | Undetected malfunction → error propagated through other circuits receiving OUT 130 | < desired Vtrigger | 0 |
| | | > desired Vtrigger | 0 |

Figure 2:
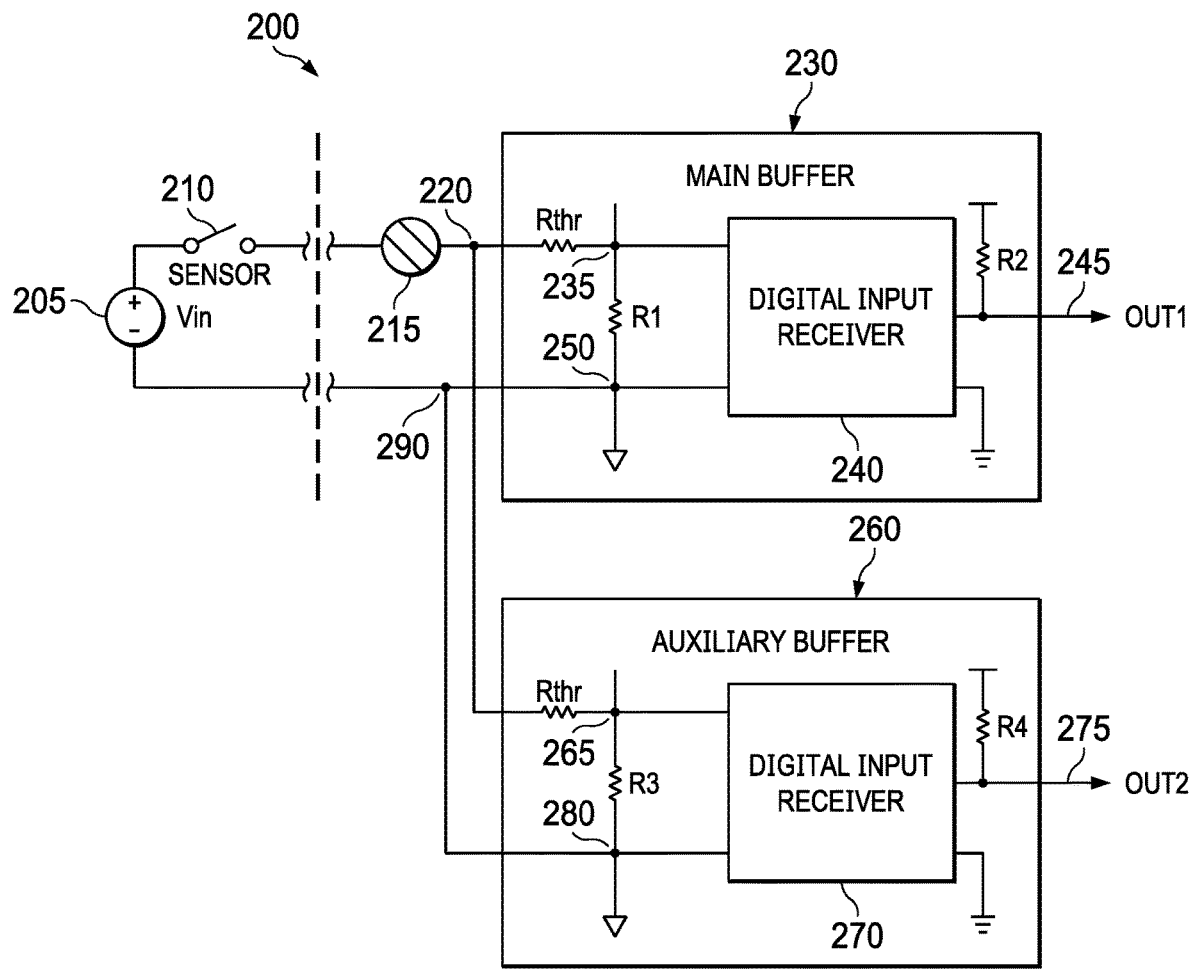
FIG. 2 illustrates an example digital input buffer with two digital input receivers in parallel.

FIG. 2 illustrates an example digital input buffer 200 with digital input receivers 240 and 270 in parallel. The digital input receivers in example buffer 200 may be any appropriate type of digital input receiver. In some examples, the digital input receivers isolate the output signals and circuits receiving them from Vin 105. In other examples, digital input receivers 240 and 270 are non-isolating. As in buffer 100, a power supply Vin 205 is coupled to a sensor 210, which acts as a closed switch in response to a control signal. For example, sensor 210 can be a pressure switch and act as a closed switch in response to pressure. Screw terminal 215 connects Vin 205 and sensor 210 to the main buffer 230 and auxiliary buffer 260 at node 220.

Main buffer 230 includes a threshold resistor Rthr, the value of which is chosen based on the desired triggering voltage Vtrigger for buffer 200. Rthr is coupled to node 220, and to R1 and digital input receiver 240 at node 235. R1 is further coupled to common mode node 250. R2 is coupled to a supply voltage and the output of digital input receiver 240. While sensor 210 acts as a closed switch, digital input receiver 240 provides an output signal OUT1 245 to other circuits, which is logic high in response to Vin 205 being greater than Vtrigger and logic low in response to Vin 205 being less than Vtrigger. Digital input receiver 240 is further coupled to common mode node 250.

Auxiliary buffer 260 includes a second threshold resistor Rthr, which is coupled to node 220, and to R3 and digital input receiver 270 at node 265. R3 is further coupled to common mode node 280. R4 is coupled to a supply voltage and the output of digital input receiver 270. Digital input receiver 270 provides an output signal OUT2 275 to other circuits, which is logic high in response to Vin 205 being greater than Vtrigger and logic low in response to Vin 205 being less than Vtrigger. Digital input receiver 270 is further coupled to common mode node 280. In example buffer 200, the Rthr in main buffer 230 has the same resistance value as the Rthr in auxiliary buffer 260, and R1 in main buffer 230 has the same resistance value as R3 in auxiliary buffer 260.

Buffer 200 experiences the same faults as buffer 100, in both main buffer 230 and auxiliary buffer 260. A short circuit across Rthr in main buffer 230, short circuit 1, or across Rthr in auxiliary buffer 260, short circuit 3, decreases the actual triggering voltage Vtrigger for the respective buffer below the desired triggering voltage. This may cause the respective buffer to output a logic high signal despite Vin 205 being less than the desired triggering voltage, which in turn causes main buffer 230 and auxiliary buffer 260 to provide different outputs to other circuits, such as a controller. Circuits receiving the outputs detect the fault condition from the different outputs, and adjust operation accordingly.

A short circuit between node 235 and node 250, short circuit 2, or between node 265 and node 280, short circuit 4, causes the current through buffer 200 to bypass the respective digital input receiver. This causes the output signal from the respective digital input receiver to remain logic low, indicating Vin 205 is less than Vtrigger, regardless of the actual value of Vin 205. In turn, this causes main buffer 230 and auxiliary buffer 260 to provide different outputs to other circuits, such as a controller. Circuits receiving the outputs detect the fault condition from the different outputs, and adjust operation accordingly.

Although circuits receiving the two output signals OUT1 245 and OUT2 275 can detect errors from digital input buffer 200, the respective digital input receivers within buffer 200 are not protected against fault conditions caused by short circuits 1 or 3. In response to short circuit 1 or 3, the current through the respective digital input receiver increases, and may result in overcurrent or overheating conditions within the respective digital input receiver. In some cases, this causes the respective digital input receiver to malfunction, which in turn may cause secondary effects in circuits receiving the outputs. Table 2 illustrates the different operating conditions of buffer 200 and the different values of Vin 205, as well as the corresponding result within the circuit and OUT1 245 from main buffer 230 and OUT2 275 from auxiliary buffer 260 while sensor 210 acts as a closed switch.

TABLE 2

| Operating Condition | Results | Vin 205 | OUT1 245 | OUT2 275 |
|---|---|---|---|---|
| Normal | Normal operation | < desired Vtrigger | 0 | 0 |
|  |  | > desired Vtrigger | 1 | 1 |
| Short 1 | Variation between actual Vtrigger and desired Vtrigger in main buffer 230 Increased current through digital input receiver 240 → potential for overcurrent and overheating conditions in main buffer 230 Malfunction detected from difference between two outputs | < desired Vtrigger > desired Vtrigger | Variable 1 | 0 1 |
| Short 2 | OUT1 left in logic low state Increased current through Rthr in main buffer 230 → potential for overcurrent and overheating conditions in main buffer 230 Malfunction detected from difference between two outputs | < desired Vtrigger > desired Vtrigger | 0 0 | 0 1 |
| Short 3 | Variation in actual Vtrigger of auxiliary buffer 260 away from desired Vtrigger Increased current through digital input receiver 270 → potential for overcurrent and overheating conditions in auxiliary buffer 260 Malfunction detected from difference between two outputs | < desired Vtrigger > desired Vtrigger | 0 1 | Variable 1 |
| Short 4 | OUT2 left in logic low state Increased current through Rthr in auxiliary buffer 260 → potential for overcurrent and overheating conditions in auxiliary buffer 260 Malfunction detected from difference between two outputs | < desired Vtrigger > desired Vtrigger | 0 1 | 0 0 |

Figure 3:
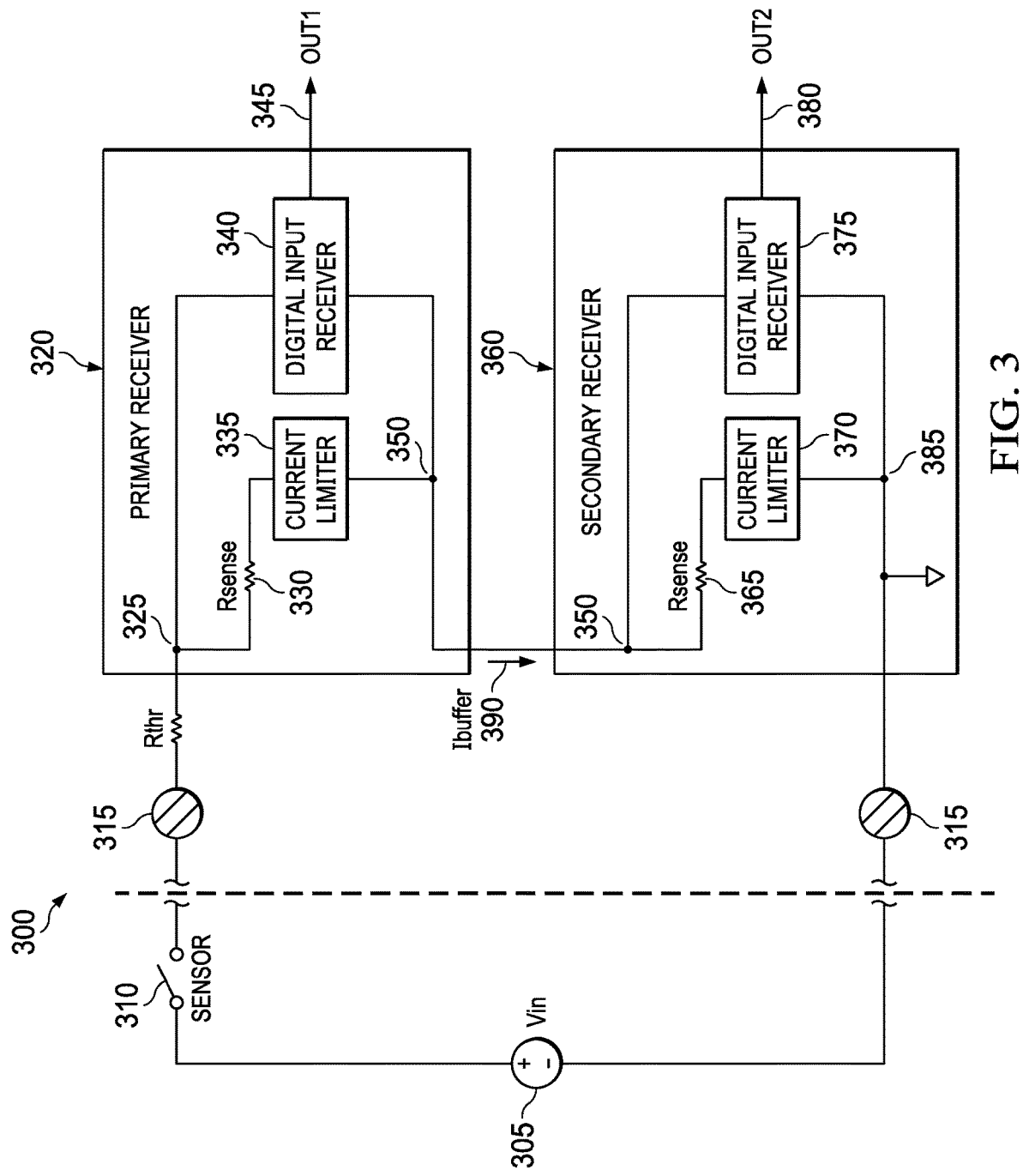
FIG. 3 illustrates an example digital input receiver circuit with a first digital input receiver in series with a second digital input receiver.

FIG. 3 illustrates an example digital input receiver circuit 300 with a first digital input receiver 340 in parallel with a first current limiter 335, both of which are in series with a second digital input receiver 375 in parallel with a second current limiter 370. The digital input receivers in example receiver circuit 300 may be any appropriate type of digital input receiver. In some examples, the digital input receivers isolate the respective output signals and connection to Vin 305 from a controller receiving the output signals. In other examples, digital input receivers 340 and 375 are non-isolating. In some examples, digital input receiver 340 and the corresponding current limiter 335 are combined in a single integrated circuit, primary receiver 320. Digital input receiver 375 and the corresponding current limiter 370 are combined in a single integrated circuit, secondary receiver 360.

As in buffers 100 and 200, a power supply Vin 305 is coupled to a sensor 310, which acts as a closed switch in response to a control signal. For example, sensor 310 can be a pressure switch and act as a closed switch in response to pressure. Screw terminal 315 connects Vin 305 and sensor 310 to an optional threshold resistor Rthr, the value of which is chosen based on the desired triggering voltage Vtrigger for receiver circuit 300. Rthr is further coupled to primary receiver 320 at node 325. In some examples, Rthr is omitted from receiver circuit 300, and primary receiver 320 is coupled directly to screw terminal 315.

Primary receiver 320 includes a resistor Rsense 330 coupled between node 325 and current limiter 335. The value of Rsense 330 is chosen to limit current within primary receiver 320 to a first current limit I1. Current limiter 335 is further coupled to node 350. Digital input receiver 340 is coupled between node 325 and node 350. Current limiter 335 and Rsense 330 function as a closed loop feedback system for digital input receiver 340, limiting the current through primary receiver 320 to the first current limit I1. Primary receiver 320 acts as a resistor in response to the current through it being less than the first current limit I1, causing OUT1 345 to be logic low. In response to the current through primary receiver 320 being greater than the first current limit I1 and while sensor 310 acts as a closed switch, digital input receiver 340 acts as a voltage comparator, causing OUT1 345 to be logic low in response to Vin 305 being less than Vtrigger and logic high in response to Vin 305 being greater than Vtrigger. During normal operation of receiver circuit 300, current limiter 335 limits the current from primary receiver 320 to secondary receiver 360, Ibuffer 390, to the first current limit I1.

Secondary receiver 360 is coupled in series to primary receiver 320 at node 350. Secondary receiver 360 includes a resistor Rsense 365 coupled between node 350 and current limiter 370. The value of Rsense 365 is chosen to limit current within secondary receiver 360 to a second current limit I2. Current limiter 370 is further coupled to common mode node 385. Digital input receiver 375 is coupled between node 350 and common mode node 385. Current limiter 370 and Rsense 365 function as a closed loop feedback system for digital input receiver 375, limiting the current through secondary receiver 360 to the second current limit I2. The second current limit I2 is greater than the first current limit I1, such that secondary receiver 360 acts as a resistor during normal operation of receiver circuit 300, in response to Ibuffer 390 being the first current limit I1, which is less than the second current limit I2. This causes OUT2 380 to be logic low. In response to the current through secondary receiver 360 being greater than the first current limit I1, such as in response to current limiter 370 setting the current within secondary receiver 360 to the second current limit I2, digital input receiver 375 causes OUT2 380 to be logic high, indicating a malfunction in primary receiver circuit 320.

Receiver circuit 300 experiences three types of faults: a short circuit across Rthr, short circuit 1; a short circuit between node 325 and node 350, short circuit 2; and a short circuit between node 350 and node 385, short circuit 3. Short circuit 1 decreases the actual Vtrigger below the desired triggering voltage. This may cause OUT1 345 to output a logic high signal despite Vin 305 being less than the desired triggering voltage. Short circuit 3 causes the current through receiver circuit 300 to bypass secondary receiver 360, which in turn causes OUT2 380 to remain logic low. Primary receiver 320 continues to function as normal during short circuit 3. During short circuit 1 or short circuit 3, digital input receivers 340 and 375 remain protected from overcurrent and overheating conditions by current limiter 335, which limits the current through receiver circuit 300 to the first current limit I1.

In the event of short circuit 2, the current through receiver circuit 300 bypasses primary receiver 320, causing OUT1 345 to remain logic low, indicating Vin 305 is less than Vtrigger regardless of the actual value of Vin 305. Ibuffer 390 is no longer set to the first current limit I1, causing Rsense 365 and current limiter 370 to limit the current through secondary receiver 360 to the second current limit I2. In response to the increased current I2, digital input receiver 375 causes OUT2 380 to be logic high, indicating a malfunction in receiver circuit 300, and in primary receiver 320 in particular. Table 3 illustrates the different operating conditions of receiver circuit 300 and the different values of Vin 305, as well as the corresponding result within the circuit and OUT1 345 and OUT2 380 while sensor 310 acts as a closed switch.

TABLE 3

| Operating Condition | Results | Vin 305 | Ibuffer 390 | OUT1 345 | OUT2 380 |
|---|---|---|---|---|---|
| Normal | Normal operation | < desired Vtrigger | I1 | 0 | 0 |
|  |  | > desired Vtrigger | I1 | 1 | 0 |
| Short 1 | Variation in actual Vtrigger away from desired Vtrigger Current remains limited to I1 | < desired Vtrigger | I1 | Variable | 0 |
|  |  | > desired Vtrigger | I1 | 1 | 0 |
| Short 2 | Current remains limited to I2 | < desired Vtrigger | I2 | 0 | 0 |
|  | Malfunction detected from OUT2 380 | > desired Vtrigger | I2 | 0 | 1 |
| Short 3 | Current remains limited to I1 | < desired Vtrigger | I1 | 0 | 0 |
|  | Primary receiver 320 operates normally | > desired Vtrigger | I1 | 1 | 0 |

Figure 4:
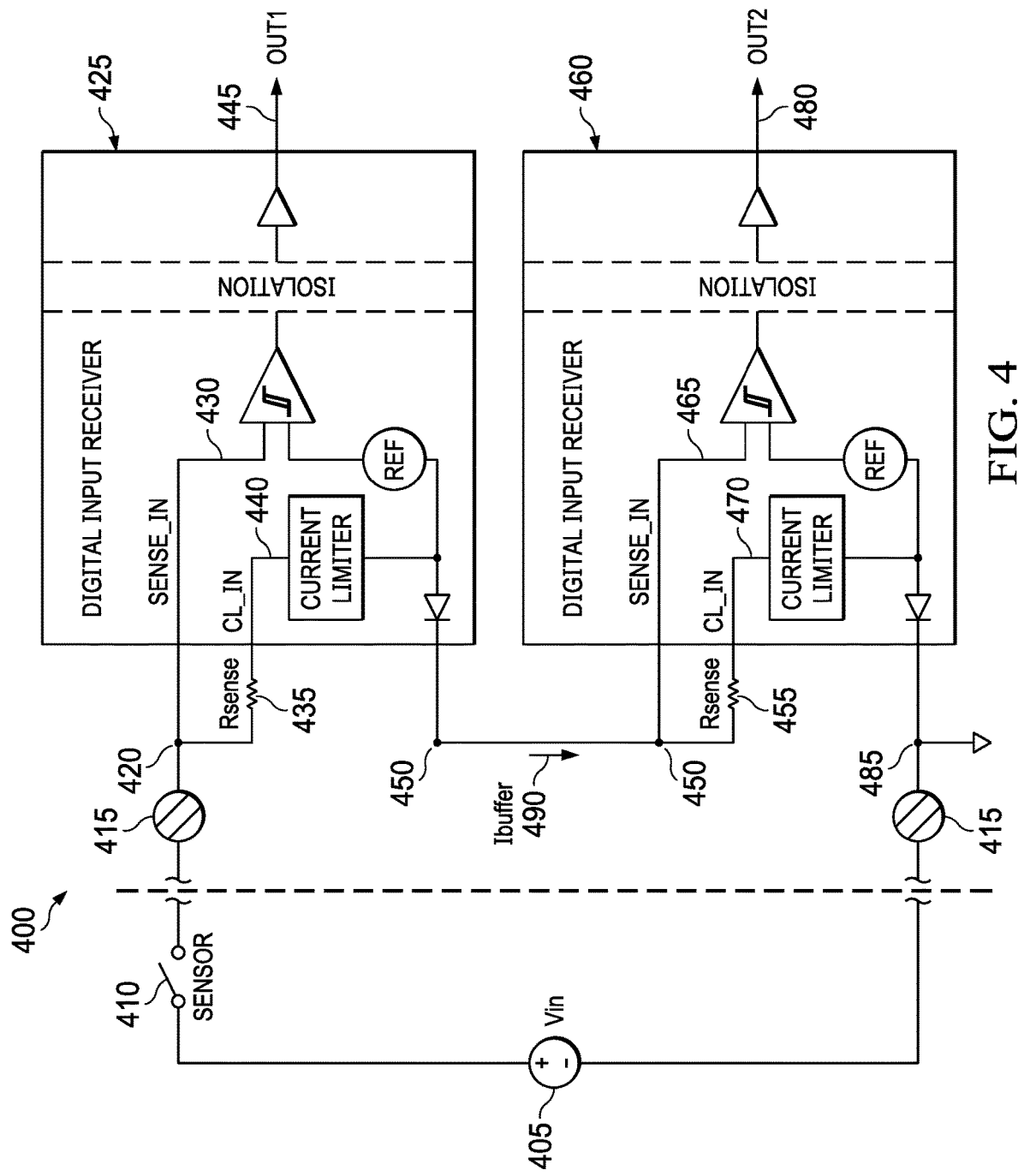
FIG. 4 illustrates an example digital input receiver circuit with a first digital input receiver and a first current limiter combined in a first integrated circuit, which is in series with a second digital input receiver and a second current limiter combined in a second integrated circuit.

FIG. 4 illustrates an example digital input receiver circuit 400 with a first digital input receiver and a first current limiter combined in a first integrated circuit 425, which is in series with a second digital input receiver and a second current limiter combined in a second integrated circuit 460. The digital input receivers in example receiver circuit 400 may be any appropriate type of digital input receiver. In some examples, the digital input receivers isolate the respective output signals and connection to Vin 405 from a controller receiving the output signals. In other examples, digital input receivers 425 and 460 are non-isolating. In example receiver circuit 400, digital input receivers 425 and 460 draw power from Vin 405. In other examples, the digital input receivers are powered by a separate field-side power supply, independent from Vin 405 input to digital input receiver circuit 400.

As in buffers 100 and 200 and receiver circuit 300, a power supply Vin 405 is coupled to a sensor 410, which acts as a closed switch in response to a control signal. For example, sensor 410 can be a pressure switch and act as a closed switch in response to pressure. In example receiver circuit 400, Vin 405 varies between 0 and 24 volts (V). Screw terminal 415 connects Vin 405 and sensor 410 to digital input receiver 425 at node 420. In example receiver circuit 400, threshold resistor Rthr is omitted, and digital input receivers 425 and 460 include voltage comparators configured to receive a control signal setting the triggering voltage Vtrigger. In example receiver circuit 400, Vtrigger is set to 15V, such that receiver circuit 400 outputs a logic high signal in response to Vin 405 being greater than 15V.

Digital input receiver 425 is coupled between node 420 and node 450. A first input to digital input receiver 425, Sense_IN 430, is coupled directly to node 420. A resistor Rsense 435 is coupled between node 420 and a second input to digital input receiver 425, CL_IN 440. The value of Rsense 435 is chosen to limit current within digital input receiver 425 to a first current limit I1, in this example 2.15 milliamps (mA). Digital input receiver 425 acts as a resistor in response to the current within it being less than 2.15 mA, causing OUT1 445 to be logic low. In response to the current within it being substantially equal to 2.15 mA, digital input receiver 425 acts as a voltage comparator, causing OUT1 445 to be logic low in response to Vin 405 being less than 15V and logic high in response to Vin 405 being greater than 15V. During normal operation, the current limiter within digital input receiver 425 limits the current within receiver circuit 400, Ibuffer 490, to 2.15 mA.

Digital input receiver 460 is coupled in series to digital input receiver 425 at node 450, and further coupled to common mode node 485. A first input to digital input receiver 460, Sense_IN 465, is coupled directly to node 450. A resistor Rsense 455 is coupled between node 450 and a second input to digital input receiver 460, CL_IN 470. The value of Rsense 455 is chosen to limit current within digital input receiver 460 to a second current limit I2, in this example 6 mA. The second current limit I2, 6 mA, is greater than the first current limit I1, 2.15 mA, such that digital input receiver 460 acts as a resistor during normal operation of receiver circuit 400 while Ibuffer 490 is 2.15 mA and less than the 6 mA second current limit I2. This causes OUT2 480 to be logic low. In response to Ibuffer 490 being 6 mA, digital input receiver 460 causes OUT2 480 to be logic high, indicating a malfunction in receiver circuit 400.

Receiver circuit 400 experiences two types of faults: a short circuit between node 420 and node 450, short circuit 1, and a short circuit between node 450 and node 485, short circuit 2. In the event of short circuit 1, the current through receiver circuit 400 bypasses digital input receiver 425, causing OUT1 445 to remain logic low, indicating Vin 405 is less than 15V regardless of the actual value of Vin 405. Ibuffer 490 is no longer set to 2.15 mA, causing digital input receiver 460 to limit the current through receiver circuit 400 to 6 mA. In response to the increased current I2, 6 mA, digital input receiver 460 causes OUT2 480 to be logic high, indicating a malfunction in receiver circuit 400 and in digital input receiver 425 in particular. Both digital input receivers 425 and 460 remain protected from overcurrent and overheating conditions by the current limiter within digital input receiver 460, which limits the current through receiver circuit 400 to the 6 mA second current limit I2.

Short circuit 2 causes the current through receiver circuit 400 to bypass digital input receiver 460, which in turn causes OUT2 480 to remain logic low. Digital input receiver 425 continues to function as during normal operating conditions. Both digital input receivers 425 and 460 remain protected from overcurrent and overheating conditions by the current limiter within digital input receiver 425, which limits the current through receiver circuit 400 to the 2.15 mA first current limit I1. Table 4 illustrates the different operating conditions of receiver circuit 400 and the different values of Vin 405, as well as the corresponding result within the circuit and OUT1 445 and OUT2 480 while sensor 410 acts as a closed switch.

TABLE 4

| Operating Condition | Results | Vin 405 | Ibuffer 490 | OUT1 445 | OUT2 480 |
|---|---|---|---|---|---|
| Normal | Normal operation | <15 V | 2.15 mA | 0 | 0 |
|  |  | >15 V | 2.15 mA | 1 | 0 |
| Short 1 | Current remains limited to I2 | <15 V | 6 mA | 0 | 0 |
|  | Malfunction detected from OUT2 480 | >15 V | 6 mA | 0 | 1 |
| Short 2 | Current remains limited to I1 | <15 V | 2.15 mA | 0 | 0 |
|  | Digital input receiver 425 operates normally | >15 V | 2.15 mA | 1 | 0 |

Figure 5:
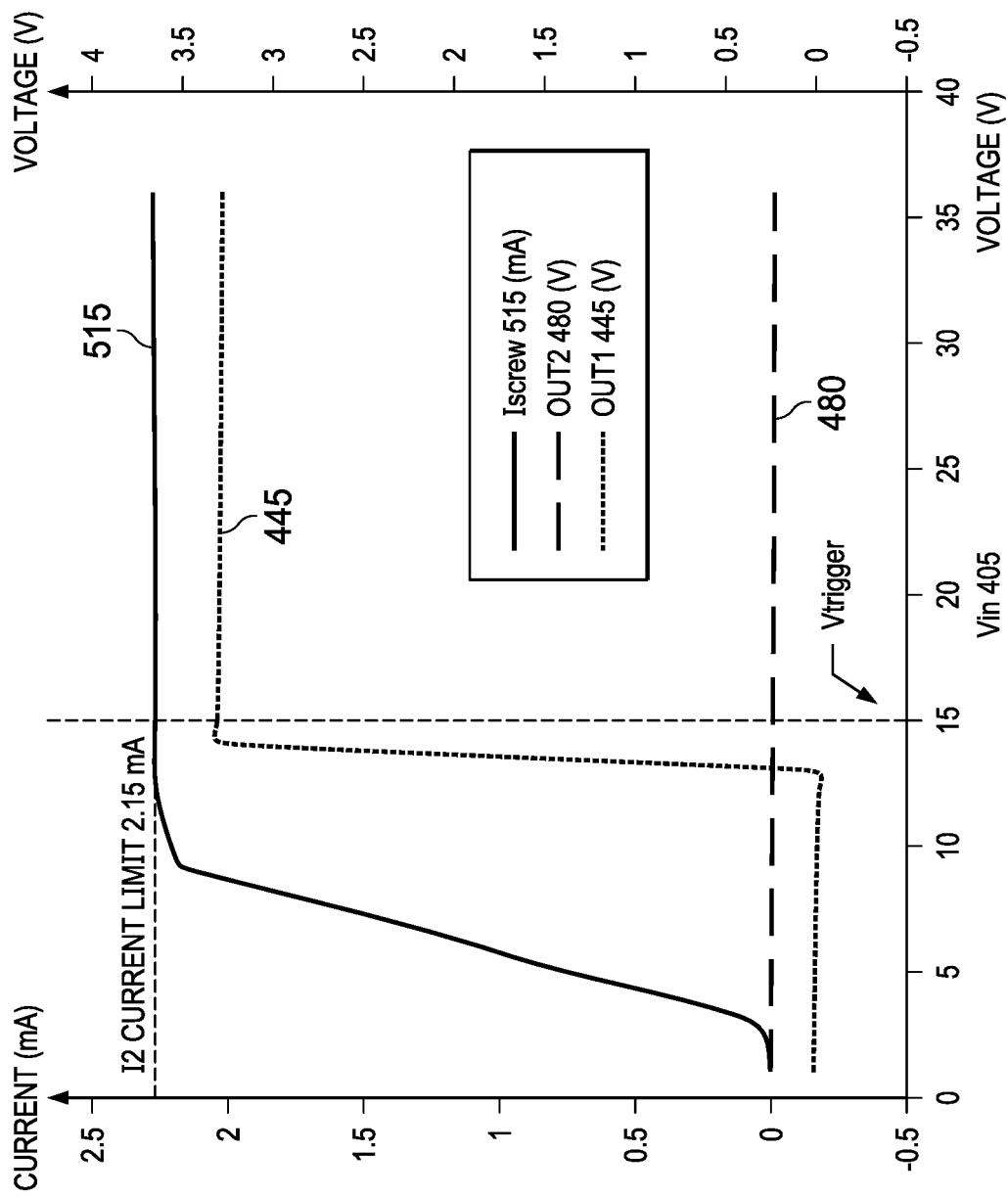
FIG. 5 shows a graph of current through components in the example digital input receiver circuit shown in FIG. 4 and voltages of output signals from the example digital input receiver circuit shown in FIG. 4.

FIG. 5 shows a graph of current through components in digital input receiver circuit 400 shown in FIG. 4 and the voltages of OUT1 445 and OUT2 480 during normal operating conditions. Two vertical axes are shown, the first indicating current in mA and the second indicating voltage in V. Iscrew 515 indicates the current through digital input receiver circuit 400. Iscrew 515 increases in response to the increasing voltage Vin 405, until it reaches the 2.15 mA current limit I1 set by the current limiter within digital input receiver 425. Out1 445 is logic high in response to Vin 405 increasing above the triggering voltage 15V. Digital input receiver 460 operates as a resistor, and OUT2 480 is kept logic low.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A receiver device, comprising:
  a first input receiver circuit, comprising:
    a first resistor coupled to a first node and a first current limiter, and
    a first voltage comparator coupled to the first node and the first current limiter, the first voltage comparator having a first output signal; and
  a second input receiver circuit, comprising:
    a second resistor coupled to a second current limiter, the first current limiter and the first voltage comparator, and
    a second voltage comparator coupled to the second current limiter, the first current limiter and the first voltage comparator, the second voltage comparator having a second output signal.

2. The receiver device of claim 1, further comprising a third resistor coupled to the first node.

3. The receiver device of claim 1, wherein the first output signal is indicative of a voltage on the first node being greater than a trigger voltage.

4. The receiver device of claim 3, wherein the trigger voltage is programmable.

5. The receiver device of claim 1, wherein the second output signal is indicative of a current within the second input receiver circuit being the second current.

6. The receiver device of claim 1, wherein the first current and the second current are less than an overcurrent threshold of the first voltage comparator and the second voltage comparator.

7. The receiver device of claim 1, wherein the first voltage comparator and the first current limiter comprise a first semiconductor die, and wherein the second voltage comparator and the second current limiter comprise a second semiconductor die.

8. The receiver device of claim 1, wherein the first output signal and the second output signal are isolated from a voltage applied to the first node.

9. A input receiver system, comprising:
  a first resistor coupled to a first node;
  a first input receiver, having a first voltage comparator input coupled to the first node and a first current limiter input coupled to the first resistor, the first input receiver having an output to provide a digital logic signal, wherein the first input receiver is further coupled to a second node;
  a second resistor coupled to the second node; and
  a second input receiver, having a second voltage comparator input coupled to the second node and a second current limiter input coupled to the second resistor, the second input receiver having an output to provide a malfunction signal.

10. The input receiver system of claim 9, wherein the first input receiver comprises a voltage comparator and a current limiter, and wherein the current limiter and the first resistor are configured to limit current within the first input receiver to a first current, the first current being less than an overcurrent threshold of the first input receiver and the second input receiver.

11. The input receiver system of claim 10, wherein:
  the voltage comparator is a first voltage comparator;
  the current limiter is a first current limiter;
  the second input receiver comprises a second voltage comparator and a second current limiter; and
  the second current limiter and the second resistor are configured to limit current within the second input receiver to a second current, the second current being less than an overcurrent threshold of the first input receiver and the second input receiver and greater than the first current.

12. The input receiver system of claim 11, wherein the malfunction signal is indicative of a current within the second input receiver being the second current.

13. The input receiver system of claim 9, further comprising a third resistor coupled between the first node and the first resistor and the first voltage comparator input.

14. The input receiver system of claim 9, wherein the digital logic signal is indicative of a voltage on the first node being greater than a trigger voltage.

15. The input receiver system of claim 14, wherein the trigger voltage is programmable.

16. The input receiver system of claim 9, wherein the digital logic signal and the malfunction signal are isolated from a voltage applied to the first node.

17. The input receiver system of claim 9, wherein the first input receiver and the second input receiver are configured to be powered by a voltage applied to the first node.

18. A receiver apparatus, comprising:
  a first resistor coupled to a first node;
  a first input receiver coupled to a second node, the first input receiver comprising:

a first voltage comparator coupled to the first node, the first voltage comparator configured to output a digital logic signal, and a first current limiter coupled to the first resistor and the first voltage comparator, the first current limiter and the first resistor configured to limit current within the first input receiver to a first current;

a second resistor coupled to the second node; and a second input receiver, comprising:

a second voltage comparator coupled to the second node, the second voltage comparator configured to output a malfunction signal, and a second current limiter coupled to the second resistor and the second voltage comparator, the second current limiter and the second resistor configured to limit current within the second input receiver to a second current, wherein the second current is greater than the first current.

19. The receiver apparatus of claim 18, wherein the first current and the second current are less than an overcurrent threshold of the first input receiver and the second input receiver.

20. The receiver apparatus of claim 18, wherein the malfunction signal is indicative of a current within the second input receiver being the second current.

21. The receiver apparatus of claim 18, wherein the digital logic signal is indicative of a voltage on the first node being greater than a trigger voltage.

22. The receiver apparatus of claim 21, wherein the trigger voltage is programmable.

23. The receiver apparatus of claim 18, wherein the second input receiver is further coupled to a common mode node.

24. The receiver apparatus of claim 18, wherein the digital logic signal and the malfunction signal are isolated from a voltage applied to the first node.

* * * * *